(12) United States Patent
Motwani et al.

(10) Patent No.: US 9,317,364 B2
(45) Date of Patent: Apr. 19, 2016

(54) MEMORY CONTROLLER WITH DISTRIBUTION TRANSFORMER

(71) Applicant: INTEL CORPORATION, Santa Clara, CA (US)

(72) Inventors: Ravi H. Motwani, San Diego, CA (US); Kiran Pangal, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 113 days.

(21) Appl. No.: 14/129,066

(22) PCT Filed: Sep. 25, 2013

(86) PCT No.: PCT/US2013/061575
§ 371 (c)(1),
(2) Date: Dec. 23, 2013

(87) PCT Pub. No.: WO2015/047239
PCT Pub. Date: Apr. 2, 2015

(65) Prior Publication Data
US 2015/0135036 A1 May 14, 2015

(51) Int. Cl.
*G11C 29/00* (2006.01)
*G06F 11/10* (2006.01)
*G06F 13/16* (2006.01)

(52) U.S. Cl.
CPC .......... *G06F 11/1076* (2013.01); *G06F 13/16* (2013.01)

(58) Field of Classification Search
CPC . G06F 11/1048; G06F 11/1012; G06F 12/00; G06F 12/14; G06F 12/0246; G06F 11/08; G06F 11/1076; G06F 13/16; G06F 11/1072; G06F 11/1044; G06F 11/1068; G11C 7/1006; G11C 29/78; G11C 11/5642; G11C 16/0483; G11C 16/10; G11C 11/5628
See application file for complete search history.

(56) References Cited

U.S. PATENT DOCUMENTS

| | | | |
|---|---|---|---|
| 2004/0028164 A1* | 2/2004 | Jiang et al. | ..................... 375/371 |
| 2004/0158688 A1 | 8/2004 | Rentschler et al. | |
| 2005/0111273 A1 | 5/2005 | Seo et al. | |

(Continued)

OTHER PUBLICATIONS

International Search Report and Written Opinion mailed Jun. 20, 2014 for International Application No. PCT/US2013/061575, 9 pages.

(Continued)

*Primary Examiner* — Guerrier Merant
(74) *Attorney, Agent, or Firm* — Schwabe, Williamson & Wyatt, P.C.

(57) ABSTRACT

Methods, apparatuses, and systems are described related to memory controllers for memory. In one embodiment, a memory controller may include a distribution transformer configured to receive data to be stored into a memory, wherein the data has a distribution of $m_1:n_1$ ratio for bits having a first logic value and bits having a second logic value, where $m_1$ and $n_1$ are real numbers. The distribution transformer may transform the data into skewed data, wherein the skewed data has a distribution of $m_2:n_2$ ratio for bits having the first logic value and bits having the second logic value, where $m_2$ and $n_2$ are real numbers that are different from one another and respectively differ from $m_1$ and $n_1$. The distribution transformer may output the skewed data for storage in the memory. Other embodiments may be described and claimed.

20 Claims, 4 Drawing Sheets

(56) References Cited

U.S. PATENT DOCUMENTS

| | | | |
|---|---|---|---|
| 2012/0226963 A1* | 9/2012 | Bivens et al. | 714/773 |
| 2013/0024746 A1* | 1/2013 | Sharon et al. | 714/766 |
| 2013/0033929 A1 | 2/2013 | Kim | |
| 2013/0044555 A1 | 2/2013 | Sutardja et al. | |
| 2013/0101111 A1* | 4/2013 | Sharon et al. | 380/28 |
| 2013/0103891 A1* | 4/2013 | Sharon et al. | 711/103 |
| 2013/0107611 A1 | 5/2013 | Cai et al. | |
| 2013/0297986 A1* | 11/2013 | Cohen | 714/763 |
| 2014/0157086 A1* | 6/2014 | Sharon et al. | 714/773 |

OTHER PUBLICATIONS

Ferreira, "Coding and Signal Processing for Error-Control Coding", Coding and Signal Processing for Magnetic Recording Systems, CRC Press, ISBN: 9781135504939, Chapter 20, Nov. 9, 2004, 23 pages.

Fan, "Constrained Coding and Error-Control Coding", Coding and Signal Processing for Magnetic Recording Systems, CRC Press, ISBN: 9781135504939, Chapter 21, Nov. 9, 2004, 15 pages.

Kashyap et al., "Sliding-Block Decodable Encoders Between (d-k)-Constrained Systems fo Equal Capacity", ISIT 2004, Chicago, USA, Jun. 27-Jul. 2, 2004, p. 87.

\* cited by examiner

MEMORY CONTROLLER WITH DISTRIBUTION TRANSFORMER

CROSS REFERENCE TO RELATED APPLICATION

The present application is a national phase entry under 35 U.S.C. § 371 of International Application No. PCT/US2013/061575, filed Sep. 25, 2013, entitled "MEMORY CONTROLLER WITH DISTRIBUTION TRANSFORMER," which designates, among the various States, the United States of America, and the entire contents and disclosures of which are hereby incorporated by reference in their entireties.

FIELD

Embodiments of the present invention relate generally to the technical field of memory. Specific embodiments relate to a memory controller.

BACKGROUND

Typically, data is written to a memory with an equal distribution of logic 0 bits and logic 1 bits. However, in some types of memory, such as phase change memory (PCM), it generally consumes more power and time to set a PCM cell to a logic 1 than to reset a PCM cell to a logic 0.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality. As used herein, "computer-implemented method" may refer to any method executed by one or more processors, a computer system having one or more processors, a mobile device such as a smartphone (which may include one or more processors), a tablet, laptop computer, a set-top box, a gaming console, and so forth.

Figure 1:
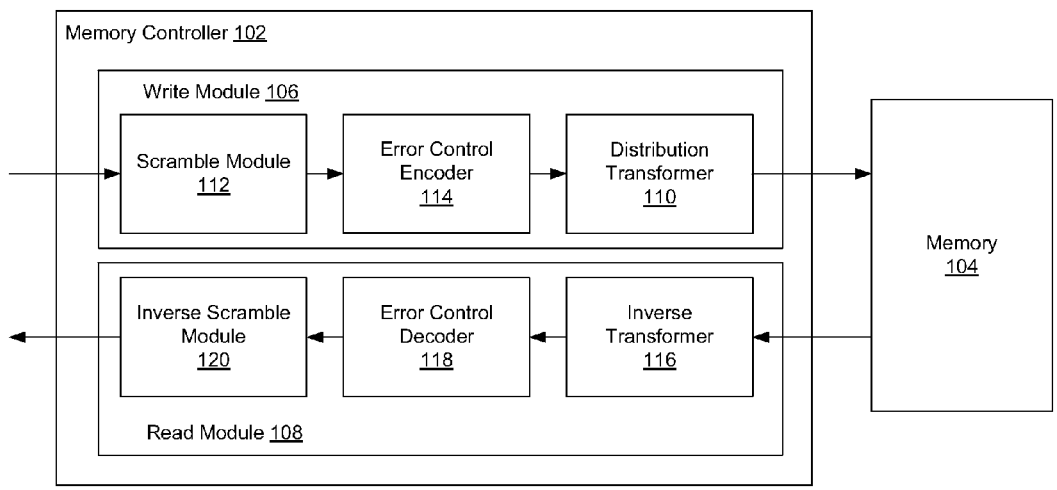
FIG. 1 illustrates an example memory controller and memory in accordance with various embodiments.

FIG. 1 illustrates a memory controller 102 and a memory 104 in accordance with various embodiments. The memory 104 may implement various forms of memory, including, but not limited to, NAND (flash) memory, ferroelectric random-access memory (FeTRAM), nanowire-based non-volatile memory, three-dimensional (3D) crosspoint memory such as phase change memory (PCM), memory that incorporates memristor technology, magnetoresistive random-access memory (MRAM), Spin Transfer Torque (STT)-MRAM, etc. The memory controller 102 may control writing data into the memory 104 and/or reading data from the memory 104. For example, the memory controller 102 may include a write module 106 for writing data into the memory 104 and a read module 108 for reading data from the memory 104. The memory controller 102 may interface with one or more other components (e.g., a processor) to allow the one or more other components to write data into the memory 104 and/or read data from the memory 104.

The memory controller 102 may be included in a same package with the memory 104 in some embodiments. In other embodiments, the memory 104 may be external to the memory controller 102.

In various embodiments, the memory controller 102 may include a distribution transformer 110 (e.g., in the write module 106). The distribution transformer 110 may receive data to be stored into the memory 104. The data received by the distribution transformer may have a plurality of bits, with each bit having one of two binary values, i.e., either a first logic value (e.g., logic 0) or a second logic value (e.g., logic 1). In embodiments, the data received by the distribution transformer may have a distribution of $m_1:n_1$ ratio for bits having the first logic value and bits having the second logic value, where $m_1$ and $n_1$ are real numbers. In some embodiments, the values $m_1$ and $n_1$ may be equal (e.g., the data received by the distribution transformer may have an equal probability of logic 0 bits and logic 1 bits). In other embodiments, the values $m_1$ and $n_1$ may be different.

In various embodiments, the distribution transformer 110 may transform the data into skewed data. The skewed data may include a plurality of bits, with each bit having one of two binary values (e.g., the first logic value or the second logic value. In embodiments, the skewed data may have a distribution of $m_2$:$n_2$ ratio for bits having the first logic value and bits having the second logic value. The values $m_2$ and $n_2$ may be real numbers that are different from one another (e.g., $m_2$ is not equal to $n_2$). Additionally, $m_2$ and $n_2$ may differ from $m_1$ and $n_1$, respectively. In some embodiments, the $m_2$:$n_2$ ratio may be a predefined ratio.

The distribution transformer 110 may output the skewed data for storage in the memory 104. For example, the memory controller 102 may pass the skewed data to the memory 104 for storage in the memory 104. The skewed data may include more of one logic value than the other. For example, the skewed data may include more logic 0 bits than logic 1 bits.

In some embodiments, the first logic value may be a logic 0 and the second logic value may be a logic 1. Additionally, $m_2$ may be greater than $n_2$. Thus, the skewed data may have more logic 0 bits than logic 1 bits.

In various embodiments, the distribution transformer 110 may add redundant bits when transforming the data received by the distribution transformer 110 to the skewed data to allow the original data (e.g., the data received by the distribution transformer 110) to be recovered from the skewed data. For example, the distribution transformer 110 may use constrained coding and/or inverse source coding techniques to add redundant bits while transforming the data to the skewed data. The redundant bits may allow the data to be accurately retrieved from the skewed data stored in the memory 102 (e.g., by the read module 108).

For example, the distribution transformer 110 may use constrained coding, e.g., including forward and/or reverse concatenation, to transform a codeword of the received data into a codeword of the skewed data. The distribution transformer 110 may reduce the probability of logic 1 bits in the codeword of the skewed data compared with the probability of logic 1 bits in the codeword of the received data. In doing so, the distribution transformer 110 may add redundant bits to the codeword of the skewed data (e.g., according to an algorithm). Thus, the codeword of the skewed data may correspond to the codeword of the received data, and the codeword of the received data may be accurately recovered from the codeword of the skewed data during a read process (further discussed below).

As an example, each zero in the received data may be converted to two zeros in the skewed data. For received data having an equal probability of logic 0 bits and logic 1 bits, this process may transform the skewed data to have a distribution of about 0.67:0.33 ratio of logic 0 bits and logic 1 bits with a 50% overhead of redundant bits. During the read process, consecutive zeros in the skewed data read from the memory 104 may be replaced with a single zero to recover the unskewed data. In other embodiments, more complex algorithms may be used to skew the received data in order to obtain the $m_2$:$n_2$ ratio with a lower overhead of redundant bits.

In various embodiments, the memory 104 may include a plurality of memory cells to store respective bits of the skewed data. In various embodiments, such as embodiments in which the memory 104 is PCM, it may consume more energy and/or time to set a memory cell of the memory 104 to a logic 1 than to reset the memory cell to a logic 0. For example, in one non-limiting embodiment, the memory 104 may be a PCM in which it consumes about 250 pJ to set a memory cell to a logic 1 and about 50 pJ to reset a memory cell to a logic 0. Additionally, or alternatively, it may consume ten times more time to set a memory cell of the PCM to a logic 1 than to reset a memory cell to a logic 0.

Accordingly, even with the added redundant bits in the skewed data, it may consume less power and/or time to store the skewed data in the memory 104 than to store data with an equal probability of logic 0 bits and logic 1 bits. Thus, the distribution transformer 110 may provide power savings and/or reduced latency for the memory controller 102 and/or memory 104.

In some embodiments, the distribution of $m_2$:$n_2$ ratio may be about 0.6:0.4 to about 0.8:0.2. For example, in one non-limiting embodiment the distribution of $m_2$:$n_2$ ratio may be about 0.68:0.32 of logic 0 bits and logic 1 bits, with a 10% overhead of additional bits for redundancy. Using the energy consumption values given in the example above, the average power consumed by a write operation per memory cell may be about 121 pJ. Thus, even with the additional redundant bits, the memory controller 102 may realize a net power consumption savings of about 20% for writing the skewed data to the memory 104 compared with writing data to the memory 104 with an equal probability of logic 0 bits and logic 1 bits. Additionally, the time savings may provide reduced latency for writing the skewed data to the memory 104.

In some embodiments, such as embodiments in which the memory 104 is NAND flash memory, the memory 104 may have an asymmetric channel in which it is more likely for logic 1 bits to inadvertently switch to logic 0 bits (e.g., due to program disturb) than it is for logic 0 bits to inadvertently switch to logic 1 bits. By skewing the data to have more logic 1 bits than logic 0 bits, the number of logic 1 bits is reduced compared with data having an equal probability of logic 0 bits and logic 1 bits, thereby reducing the occurrence of program disturb errors.

In some embodiments, the write module 106 of the memory controller 102 may further include a scramble module 112 and an error control encoder 114. The scramble module 112 may receive unscrambled data to be written into the memory 104 (e.g., from another component, such as a processor). The unscrambled data may have a random distribution of logic 0 bits and logic 1 bits. In response, the scramble module 112 may scramble the unscrambled data and output the scrambled data. The scrambled data may have the distribution of $m_1$:$n_1$ ratio of logic 0 bits and logic 1 bits. For example, the scramble module 112 may scramble the unscrambled data to have a 1:1 distribution of logic 0 bits and logic 1 bits (e.g., $m_1$=$n_1$). The scramble module 112 may scramble the unscrambled data based on an algorithm to obtain the scrambled data.

In various embodiments, the error control encoder 114 may add error control encoding to the scrambled data to generate the data that is received by the distribution transformer 110. The error control encoding may be used to detect and/or correct errors in the data. For example, the error control encoder 114 may generate an error correction code (ECC) associated with the scrambled data. The ECC may include one or more bits that are determined from the scrambled data by an ECC algorithm. In some embodiments, a 1:1 distribution of logic 0 bits and logic 1 bits, as may be provided by the scramble module 112, may facilitate effective error control encoding.

As discussed above, the memory controller 102 may further include a read module 108 to read data from the memory 104. In various embodiments, the read module 108 may include an inverse transformer 116 to receive outgoing data that is read from the memory 104. The outgoing data may have the distribution of $m_2$:$n_2$ ratio of bits having the first logic value and bits having the second logic value. The inverse transformer 116 may transform the outgoing data from having the distribution of $m_2$:$n_2$ ratio to unskewed data having a distribution of $m_1$:$n_1$ ratio of bits having the first logic value and bits having the second logic value. The inverse transformer 116 may use the redundant bits in the outgoing data to generate the unskewed data. For example, the inverse transformer 116 may use an algorithm to generate the unskewed data from the outgoing data that is the inverse of the algorithm used by the distribution transformer 110 to generate the skewed data. Thus, the inverse transformer 116 may remove the redundant bits in the skewed data that were inserted by the distribution transformer 110, and transform the skewed data back into unskewed data. Accordingly, the data that was received by the distribution transformer 110 may be accurately retrieved by the inverse transformer 116.

In some embodiments, the memory controller 102 may further include an error control decoder 118 to decode error control encoding on the outgoing data. The error control decoder 118 may initiate an error recovery process based on an outcome of decoding the error control encoding. For example, the error control decoder 118 may use the ECC that was generated by the error control encoder 114 to determine if the data received by the error control decoder 118 matches the data received by the error control encoder 114. If the data received by the error control decoder 118 does not match the data received by the error control encoder 114, the error control decoder 118 may recover the data based on the ECC.

In embodiments in which the memory controller includes the scramble module 112, the memory controller 102 may further include an inverse scramble module 120 to receive the outgoing data after being transformed by the inverse transformer (e.g., the unskewed data). The inverse scramble module 120 may unscramble the outgoing data (e.g., using an algorithm that is an inverse of the algorithm used by the scramble module 112). Accordingly, the inverse scramble module 120 may output the data as received by the scramble module 112 (e.g., with a random distribution of bits with the first logic state and the second logic state).

Accordingly, the memory controller 102 may provide accurate storage of data in PCM, while providing power savings over prior memory controllers.

Figure 2:
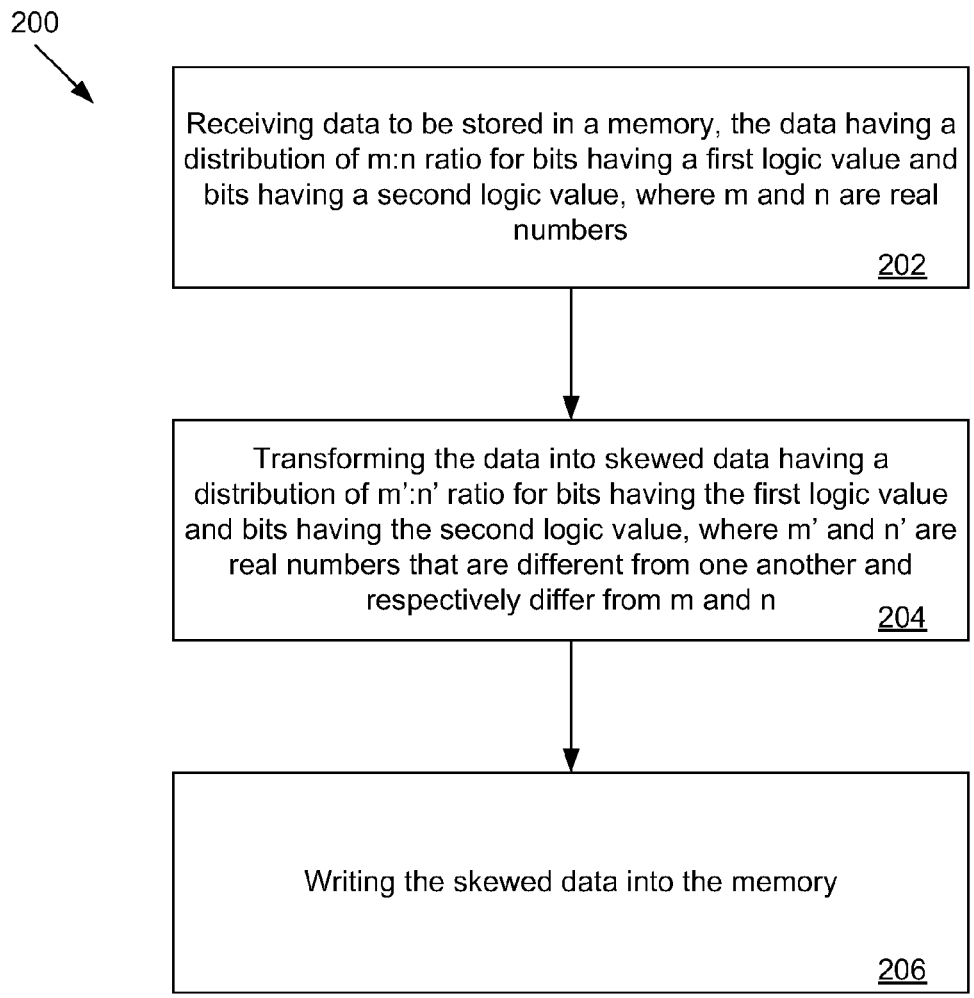
FIG. 2 illustrates a method for writing data into a memory in accordance with various embodiments.

FIG. 2 illustrates a method 200 for writing data to a memory (e.g., memory 104) in accordance with various embodiments. In some embodiments, the method 200 may be performed by a memory controller (e.g., memory controller 102).

At 202, method 200 may include receiving data to be stored in a memory (e.g., memory 104), the data having a distribution of $m_1:n_1$ ratio for bits having a first logic value and bits having a second logic value, where m and n are real numbers. For example, in some embodiments, $m_1$ may be equal to $n_1$.

At 204, the method 200 may include transforming the data into skewed data having a distribution of $m_2:n_2$ ratio for bits having the first logic value and bits having the second logic value. The values $m_2$ and $n_2$ may be real numbers that are different from one another and respectively differ from $m_1$ and $n_1$. In some embodiments, the first logic value may be a logic 0, the second logic value may be a logic 1, and $m_2$ may be greater than $n_2$. For example, in some embodiments, the distribution of $m_2:n_2$ ratio may be about 0.6:0.4 to about 0.8:0.2. In some embodiments, transforming the data at 204 may include adding redundant bits to the data.

At 206, the method 200 may include writing the skewed data into the memory.

Figure 3:
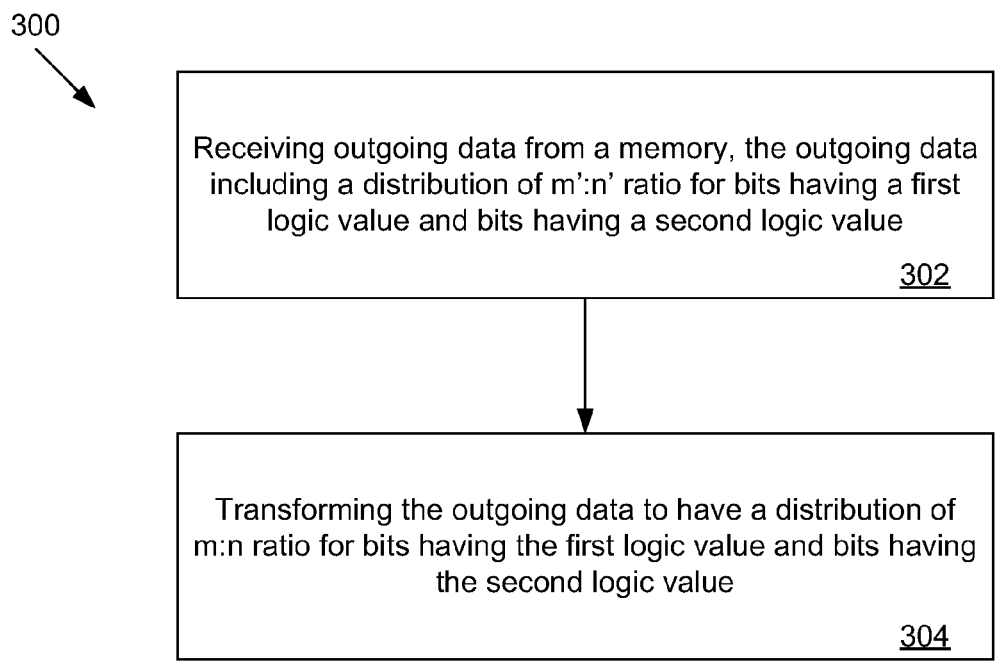
FIG. 3 illustrates a method for reading data from a memory in accordance with various embodiments.

FIG. 3 illustrates a method 300 for reading data from a memory (e.g., memory 104) in accordance with various embodiments. In some embodiments, the method 300 may be performed by a memory controller (e.g., memory controller 102). The method 300 may be performed in conjunction with method 200 discussed above (e.g., to read the data that was written during method 200).

At 302, the method 300 may include reading outgoing data from the memory. The outgoing data may include the distribution of $m_2:n_2$ ratio for bits having the first logic value and bits having the second logic value.

At 304, the method 300 may include transforming the outgoing data to have the distribution of $m_1:n_1$ ratio for bits having the first logic value and bits having the second logic value.

Figure 4:
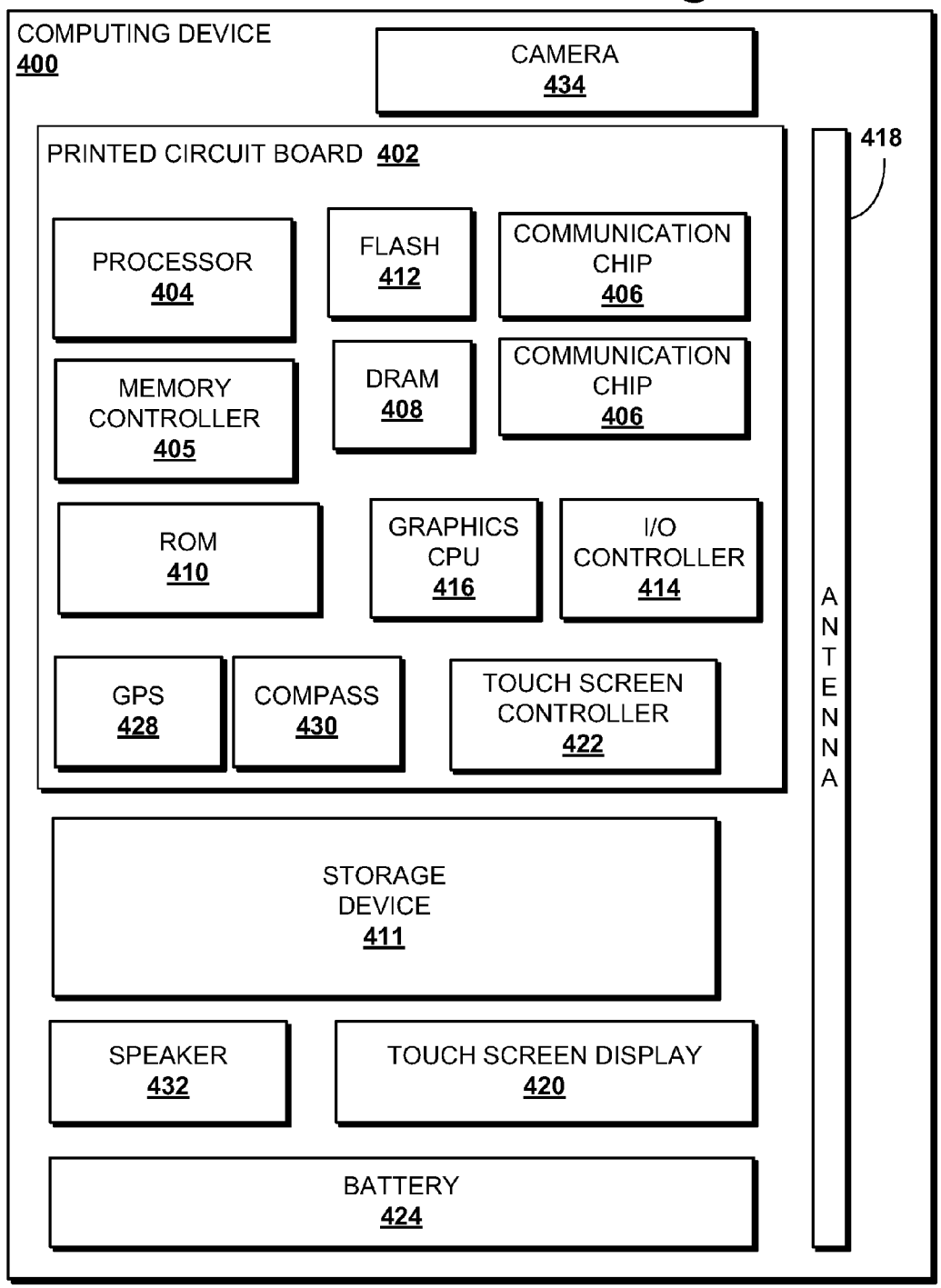
FIG. 4 illustrates an example system configured to employ the apparatuses and methods described herein, in accordance with various embodiments.

FIG. 4 illustrates an example computing device 400 which may employ the apparatuses and/or methods described herein (e.g., memory controller 102, memory 104, method 200, and/or method 300), in accordance with various embodiments. As shown, computing device 400 may include a number of components, such as one or more processor(s) 404 (one shown) and at least one communication chip 406. In various embodiments, the one or more processor(s) 404 each may include one or more processor cores. In various embodiments, the at least one communication chip 406 may be physically and electrically coupled to the one or more processor(s) 404. In further implementations, the communication chip 406 may be part of the one or more processor(s) 404. In various embodiments, computing device 400 may include printed circuit board (PCB) 402. For these embodiments, the one or more processor(s) 404 and communication chip 406 may be disposed thereon. In alternate embodiments, the various components may be coupled without the employment of PCB 402.

Depending on its applications, computing device 400 may include other components that may or may not be physically and electrically coupled to the PCB 402. These other components include, but are not limited to, memory controller 405, volatile memory (e.g., DRAM 408), non-volatile memory such as read only memory 410 (ROM) and storage device 411 (e.g., a hard disk drive (HDD)), an I/O controller 414, a digital signal processor (not shown), a crypto processor (not shown), a graphics processor 416, one or more antenna 418, a display (not shown), a touch screen display 420, a touch screen controller 422, a battery 424, an audio codec (not shown), a video codec (not shown), a global positioning system (GPS) device 428, a compass 430, an accelerometer (not shown), a gyroscope (not shown), a speaker 432, a camera 434, and a mass storage device (such as hard disk drive, a solid state drive, compact disk (CD), digital versatile disk (DVD))(not shown), and so forth. In various embodiments, the processor 404 may be integrated on the same die with other components to form a System on Chip (SoC).

In various embodiments, rather than or in addition to storage device 412, computing device 400 may include resident non-volatile memory, e.g., flash memory 412. In some embodiments, the one or more processor(s) 404 and/or flash 412 may include associated firmware (not shown) storing programming instructions configured to enable computing device 400, in response to execution of the programming instructions by one or more processor(s) 404, to practice all or selected aspects of the methods described herein (e.g., method 400). In various embodiments, these aspects may additionally or alternatively be implemented using hardware separate from the one or more processor(s) 404 or flash memory 412.

In various embodiments, memory controller 405 may include the memory controller 102 described herein. The DRAM 408, flash memory 412, and/or storage device 411 may include the memory 104 described herein. The memory controller 405 may be used to read data from, or write data to, the DRAM 408, flash memory 412, and/or storage device 411. In embodiments, the memory controller 405 may practice method 200 and/or 300.

In some embodiments, memory controller 405 may be included in a memory controller hub (MCH) of the computing device 400. The memory controller 405 may additionally or alternatively be included in one or more other components of the computing device 400, e.g., one or more of processors 404, DRAM 408, flash memory 412, and/or storage device 411. In some embodiments, the memory controller 405 may be packaged with one or more of processors 404 to form a system on chip (SoC).

The communication chips 406 may enable wired and/or wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to IEEE 702.20, General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

In various implementations, the computing device 400 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 400 may be any other electronic device that processes data.

Some non-limiting examples are provided below.

Example 1 includes an apparatus for writing or reading data, comprising: a distribution transformer configured to: receive data to be stored into the memory, wherein the data has a distribution of $m_1:n_1$ ratio for bits having a first logic value and bits having a second logic value, where $m_1$ and $n_1$ are real numbers; transform the data into skewed data, wherein the skewed data has a distribution of $m_2:n_2$ ratio for bits having the first logic value and bits having the second logic value, where $m_2$ and $n_2$ are real numbers that are different from one another and respectively differ from $m_1$ and $n_1$; and output the skewed data for storage in the memory.

Example 2 includes the apparatus of Example 1, wherein the distribution transformer is further configured to add redundant bits when transforming the data to the skewed data.

Example 3 includes the apparatus of Example 1, further comprising a scramble module to receive unscrambled data to be written into the memory, and in response, scramble the unscrambled data, and output scrambled data; and an error control encoder coupled between the scrambling module and distribution transformer to add error control encoding to the scrambled data to generate the data for storage in memory for the distribution transformer.

Example 4 includes the apparatus of Example 1, wherein the memory is a phase change memory.

Example 5 includes the apparatus of Example 4, wherein $m_2$ is greater than $n_2$, and wherein the first logic value is a logic 0 and the second logic value is a logic 1.

Example 6 includes the apparatus of Example 1, further comprising an inverse transformer configured to receive outgoing data that is read from the memory, the outgoing data having the distribution of $m_2:n_2$ ratio of bits having the first logic value and bits having the second logic value, and the inverse transformer configured to transform the outgoing data from having the distribution of $m_2:n_2$ ratio to have a distribution of $m_1:n_1$ ratio of bits having the first logic value and bits having the second logic value.

Example 7 includes the apparatus of any one of Examples 1 to 6, wherein the distribution of $m_1:n_1$ ratio is about 1:1, and the distribution of $m_2:n_2$ ratio is about 0.6:0.4 to 0.8:0.2.

Example 8 includes a method for writing or reading data comprising: receiving data to be stored in a memory, wherein the data has a distribution of $m_1:n_1$ ratio for bits having a first logic value and bits having a second logic value, where $m_1$ and $n_1$ are real numbers; transforming the data into skewed data, wherein the skewed data has a distribution of $m_2:n_2$ ratio for bits having the first logic value and bits having the second logic value, where $m_2$ and $n_2$ are real numbers that are different from one another and respectively differ from $m_1$ and $n_1$; and writing the skewed data into the memory.

Example 9 includes the method of Example 8, wherein the transforming the data into skewed data includes adding redundant bits to the data to generate the skewed data.

Example 10 includes the method of Example 10, wherein $m_2$ is greater than $n_2$, and wherein the first logic value is a logic 0 and the second logic value is a logic 1.

Example 11 includes the method of Example 9, further comprising: receiving unscrambled data to be stored in the memory; and scrambling the unscrambled data to have the distribution of $m_1:n_1$ ratio.

Example 12 includes the method of Example 11, further comprising adding error control encoding to the scrambled data.

Example 13 includes the method of any one of Examples 9 to 12, wherein the memory is a phase change memory.

Example 14 includes the method of any one of Examples 9 to 12, further comprising: reading outgoing data from the memory, the outgoing data having the distribution of $m_2:n_2$ ratio; and transforming the outgoing data to have the distribution of $m_1:n_1$ ratio.

Example 15 includes a system for reading or writing data comprising: a memory and a write module coupled to the memory. The write module includes a distribution transformer to: receive data to be stored into the memory; and transform the data into skewed data, wherein the skewed data has a distribution of $m_2:n_2$ ratio for logic 0 bits and logic 1 bits, where $m_2$ and $n_2$ are real numbers and $m_2$ is greater than $n_2$. The write module is further configured to write the skewed data into the memory.

Example 16 includes the system of Example 15, wherein the distribution transformer is further to add redundant bits to the data to transform the data into the skewed data.

Example 17 includes the system of Example 15, wherein the distribution transformer is configured to receive the data with a distribution of $m_1:n_1$ ratio for logic 0 bits and logic 1 bits, where $m_2$ and $n_2$ are respectively different from $m_1$ and $n_1$, and the system further comprising a read module coupled to the memory and including an inverse transformer configured to: receive outgoing data from the memory, the outgoing data having the distribution of $m_2:n_2$ ratio for logic 0 bits and logic 1 bits; and transform the outgoing data to have the distribution of $m_1:n_1$ ratio for logic 0 bits and logic 1 bits.

Example 18 includes the system of Example 17, wherein the write module further includes: a scramble module configured to receive the incoming data, to scramble the incoming data to have a distribution of 1:1 ratio of logic 0 bits and logic 1 bits, and to pass the scrambled incoming data to the distribution transformer to be skewed; and an error control encoder coupled to the scramble module and configured to add error control encoding to the scrambled data.

Example 19 includes the system of Example 18, wherein the read module further includes: an inverse scramble module to receive the outgoing data after being transformed by the inverse transformer and to unscramble the outgoing data; and an error control decoder to decode the error control encoding on the outgoing data.

Example 20 includes the system of any one of Examples 16 to 19, wherein the distribution of $m_2:n_2$ ratio is about 0.6:0.4 to 0.8:0.2.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. An apparatus comprising:
    a distribution transformer circuit to:
        receive data to be stored into a memory, wherein the data has a first length and a distribution of $m_1:n_1$ ratio for bits having a first logic value and bits having a second logic value, where $m_1$ and $n_1$ are real numbers, wherein the memory comprises a plurality of memory cells that require a first amount of power to set a memory cell to the first logic value, and a second amount of power to set the memory cell to the second logic value, wherein the second amount of power is greater than the first amount of power;
        transform the data into skewed data, wherein the skewed data has a second length and a distribution of $m_2:n_2$ ratio for bits having the first logic value and bits having the second logic value, where the second length is longer than the first length, $m_2$ and $n_2$ are real numbers that are different from one another, with $m_2$ greater than $m_1$ and $n_2$ smaller than $n_1$, wherein $m_2$ and $n_2$ are selected in view of the first and second amount of power required to set a memory cell to the first or second logic value; and
        output the skewed data for storage in the memory, using less power required to store the data.

2. The apparatus of claim 1, wherein the distribution transformer circuit is to add redundant bits when transforming the data of first length to the skewed data of second length.

3. The apparatus of claim 1, further comprising a scramble circuit to receive unscrambled data to be written into the memory, and in response, scramble the unscrambled data, and output scrambled data; and an error control encoder circuit coupled between the scrambling circuit and the distribution transformer circuit to add error control encoding to the scrambled data to generate the data of first length for storage in memory for the distribution transformer circuit.

4. The apparatus of claim 1, wherein the memory is a phase change memory.

5. The apparatus of claim 4, wherein $m_2$ is greater than $n_2$, and wherein the first logic value is a logic 0 and the second logic value is a logic 1.

6. The apparatus of claim 1, further comprising an inverse transformer circuit to receive outgoing data that is read from the memory, the outgoing data having the second length, and the distribution of $m_2:n_2$ ratio of bits having the first logic value and bits having the second logic value, and the inverse transformer circuit to transform the outgoing data from having the second length and the distribution of $m_2:n_2$ ratio to have the first length and a distribution of $m_1:n_1$ ratio of bits having the first logic value and bits having the second logic value.

7. The apparatus of claim 1, wherein the first amount of power is about 250 pj; the second amount of power is about 50 pj, the distribution of $m_1:n_1$ ratio is about 1:1, and the distribution of $m_2:n_2$ ratio, selected in view of the first and second amount of power, is about 0.6:0.4 to 0.8:0.2.

8. A method comprising:
    receiving data of a first length to be stored in a memory, wherein the data has a distribution of $m_1:n_1$ ratio for bits having a first logic value and bits having a second logic value, where $m_1$ and $n_1$ are real numbers, wherein the memory comprises a plurality of memory cells that require a first amount of power to set a memory cell to the first logic value, and a second amount of power to set the memory cell to the second logic value, wherein the second amount of power is greater than the first amount of power;
    transforming the data into skewed data, wherein the skewed data has a second length and a distribution of $m_2:n_2$ ratio for bits having the first logic value and bits having the second logic value, where the second length is longer than the first length, $m_2$ and $n_2$ are real numbers that are different from one another, with $m_2$ greater than $m_1$ and $n_2$ is smaller than $n_1$, wherein m2 and n2 are selected in view of the first and second amount of power required to set a memory cell to the first or second logic value; and
    writing the skewed data into the memory, using less power than writing the data into the memory.

9. The method of claim 8, wherein the transforming the data into skewed data includes adding redundant bits to the data of first length to generate the skewed data of second length.

10. The method of claim 8, wherein $m_2$ is greater than $n_2$, and wherein the first logic value is a logic 0 and the second logic value is a logic 1.

11. The method of claim 8, further comprising:
    receiving unscrambled data to be stored in the memory; and
    scrambling the unscrambled data to have the distribution of $m_1:n_1$ ratio.

12. The method of claim 11, further comprising:
    adding error control encoding to the scrambled data to generate the data of first length.

13. The method of claim 9, wherein the memory is a phase change memory; and wherein the first amount of power is about 250 pj; the second amount of power is about 50 pj, the distribution of $m_1:n_1$ ratio is about 1:1, and the distribution of $m_2:n_2$ ratio, selected in view of the first and second amount of power, is about 0.6:0.4 to 0.8:0.2.

14. The method of claim 9, further comprising:
reading outgoing data from the memory, the outgoing data having the second length the distribution of $m_2:n_2$ ratio; and
transforming the outgoing data to have the first length and the distribution of $m_1:n_1$ ratio.

15. A system comprising:
a memory;
a write circuit coupled to the memory, the write circuit including a distribution transformer circuit to:
receive data of first length to be stored into the memory, wherein the memory comprises a plurality of memory cells that require a first amount of power to set a memory cell to a logic 0, and a second amount of power to set the memory cell to a logic 1, wherein the second amount of power is greater than the first amount of power; and
transform the data into skewed data, wherein the skewed data has a second length, and a distribution of $m_2:n_2$ ratio for logic 0 bits and logic 1 bits, where the second length is longer than the first length, $m_2$ and $n_2$ are real numbers, and $m_2$ is greater than $n_2$, and m2 and n2 are selected in view of the first and second amount of power required to set a memory cell to logic 0 or logic 1;
wherein the write circuit is further to write the skewed data into the memory, using less power than writing the data into memory.

16. The system of claim 15, wherein the distribution transformer circuit is further to add redundant bits to the data of first length to transform the data into the skewed data of second length.

17. The system of claim 15, wherein the distribution transformer circuit is to receive the data of first length with a distribution of $m_1:n_1$ ratio for logic 0 bits and logic 1 bits, where $m_2$ is greater than $m_1$ and $n_2$ is smaller than n1, m2 and n2 are selected in view of the first and second amount of power required to set a memory cell to the first or second logic value, and the system further comprises a read circuit coupled to the memory and including an inverse transformer circuit to:
receive outgoing data from the memory, the outgoing data having the second length and the distribution of $m_2:n_2$ ratio for logic 0 bits and logic 1 bits; and
transform the outgoing data to have the first length and the distribution of $m_1:n_1$ ratio for logic 0 bits and logic 1 bits.

18. The system of claim 17, wherein the write circuit further includes:
a scramble circuit to receive the incoming data, to scramble the incoming data to have a distribution of 1:1 ratio of logic 0 bits and logic 1 bits, and to pass the scrambled incoming data to an error control encoder circuit to add error control encoding to the scrambled data to generate the data to be written into the memory; and
an error control encoder circuit coupled to the scramble circuit to add error control encoding to the scrambled data to generate the data, and output the data to the distribution transformer circuit to be skewed, and written into the memory.

19. The system of claim 18, wherein the read circuit includes:
an error control decoder circuit to decode outgoing data from memory, after being transformed by an inverse transformer, and remove error control encoding from the decoded outgoing data; and
an inverse scramble circuit to receive outgoing data after error control encoding has been removed from the outgoing data, and unscramble the outgoing data.

20. The system of claim 15, wherein the first amount of power is about 250 pj; the second amount of power is about 50 pj, and the distribution of $m_2:n_2$ ratio is about 0.6:0.4 to 0.8:0.2, selected in view of the first and second amount of power.

* * * * *